United States Patent [19]
Chambers

[11] 3,823,351
[45] July 9, 1974

[54] SEMI-CONDUCTOR AND HEAT SINK FIN ASSEMBLY

[75] Inventor: Arthur E. Chambers, Grosse Isle, Mich.

[73] Assignee: Carbidex Corporation, Southgate, Mich.

[22] Filed: Sept. 6, 1973

[21] Appl. No.: 394,734

Related U.S. Application Data

[63] Continuation-in-part of Ser. No. 291,898, Sept. 25, 1972, abandoned.

[52] U.S. Cl. .................. 317/234 R, 174/15, 165/80, 317/234 A, 317/234 G
[51] Int. Cl. .................. H01l 3/00, H01l 5/00
[58] Field of Search ............ 317/235, 1.1, 5, 4, 4.1, 317/11; 165/80, 105; 174/15

[56] References Cited

UNITED STATES PATENTS

| | | | |
|---|---|---|---|
| 2,854,609 | 9/1958 | Hedding | 317/234 W |
| 3,240,263 | 3/1966 | Stewart | 317/234 A |
| 3,241,605 | 3/1966 | Tabor | 317/234 |
| 3,395,321 | 7/1968 | Boyer | 317/234 A |
| 3,457,988 | 7/1969 | Meyerhoff et al. | 317/234 A |

*Primary Examiner*—Andrew J. James
*Attorney, Agent, or Firm*—Cullen, Settle, Sloman & Cantor

[57] ABSTRACT

A semi-conductor is housed within a metallic can closed at its top and having a base flange and one or more heat sink fins. Each heat sink fin includes a flexible metallic heat conductive body 0.005 inch thick of disc-shape, centrally apertured and snugly and frictionally mounted over said can. Each fin includes a central annular flange. The fins and flanges in registry for uniform spacing.

1 Claim, 4 Drawing Figures

SEMI-CONDUCTOR AND HEAT SINK FIN ASSEMBLY

RELATED APPLICATION

This application is a continuation-in-part of copending application Ser. No. 291,898 filed Sept. 25, 1972 and now abandoned.

BACKGROUND OF THE INVENTION

In the present use of semi-conductors such as transistors, rectifiers, diodes, thyristors or other semi-conductors, a certain amount of undesired heat is generated in the use of such solid state semi-conductor devices. There has, therefore, been the need of, in some efficient manner, conducting away this unwanted bi-product and also, thus, prolong the life of the electronic device.

There have been involved and complicated cooling mechanisms, such as the use of forced air, and other heat conducting devices which have been impractical or costly in manufacture or difficult to assemble in view of the very small size of the semi-conductor assembly which has, in many instances, a diameter no greater than 1/16 to 1/4 inch, for illustration.

Examples of prior art devices presently known for accomplishing this or similar results are the following U.S. Pat. Nos.: 2,883,591; 3,222,580; 2,958,515; 3,372,733; 3,033,537; 3,457,988; 3,205,936; 3,537,517.

BRIEF DESCRIPTION OF THE INVENTION

It is an object of the present invention to provide for these electrical components, which include transistors, rectifiers, diodes, thyristors and others, a suitable heat sink fin which is stamped out of a heat conductive material, such as aluminum or other, and which is centrally apertured for manual or machine assembly over and upon the component can or housing for a firm and effective surface contact therewith and, thus, to increase the area for air circulation, normal or mechanical, for the conducting away of the undesired heat bi-product of the operation of such semi-conductor and for prolonging its life.

These and other objects will be seen from the following specification and claims in conjunction with the appended drawing in which:

Figure 1:
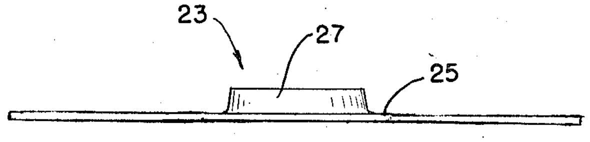
FIG. 1 is a side elevational view of the present heat sink fin.

It will be understood that the above drawing illustrates merely a preferred embodiment of the invention, and that other embodiments are contemplated within the scope of the claims hereafter set forth.

REFERRING TO THE DRAWING

An electrical component 11 which includes a small cylindrical metallic can 13 which has a closed top 15 to which is applied indicia, and at its other end a base flange 17 and including an eyelet header 19 apertured to have projected therethrough a series of lead wires 21. The edges of the top are rounded defining an annular fillet 22. The can is formed by drawing, and is not subsequently polished. Therefore, the can is microscopically rough.

For the dissipation of heat from such component 13, there is provided one or more a series of heat sink fins 23, namely, a stamping made of aluminum, for illustration, or anodized aluminum. Said fins may also be made of nickel, beryllium, copper, aluminum alloy, beryllium oxide, or plastic material.

Figure 2:
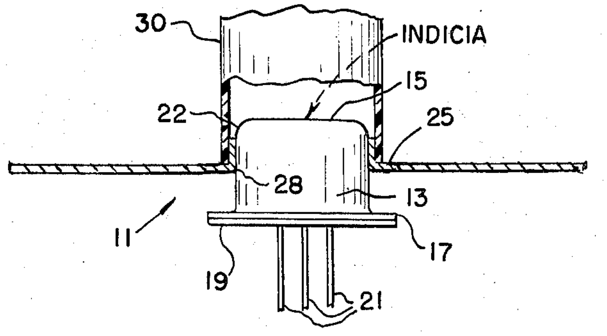
FIG. 2 is a side elevational view of a semi-conductor can with a single heat sink fin pressed thereon shown in section and a tool therefore, partly broken away and sectioned.
Figure 3:
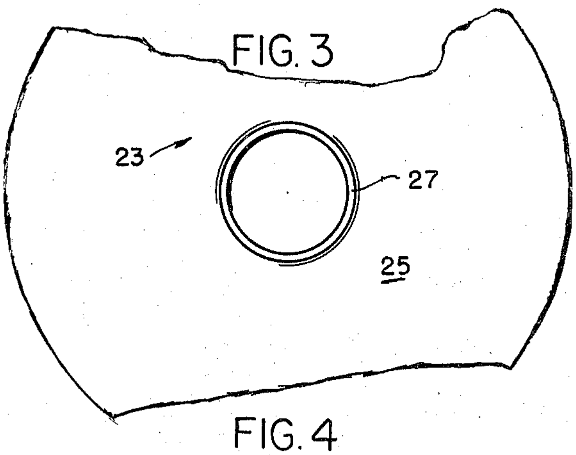
FIG. 3 is a plan view of the heat sink fin.
Figure 4:
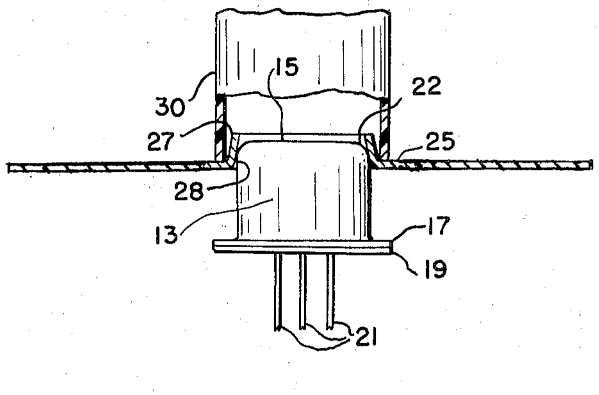
FIG. 4 is a fragmentary view of the initial positioning of the fin and tool relative to the can before assembly onto the can.

The heat sink fin has a thin circular flexible body 25, which is centrally apertured and which has at its center an upstanding somewhat tapered inwardly annular flange 27. The fin body is rounded at 28 where it joins the flange to define an annular fillet. The diameter of the body is several times the flange aperture. The flange internal diameter is substantially the same as the can diameter for an interference fit when assembled thereon, as by using a tool 30. The bore of the flange 27 is tapered inwardly from bottom to top, as shown in FIG. 4. On pressure assembly of the fin onto the can by tool 30, the fin flexes and the flange is stressed to a uniform bore for snug frictional self securing assembly to the can, FIG. 2.

While one fin may be sufficient for conducting away unwanted heat, where more cooling is desired, a plurality of said such heat sink fins may be mechanically assembled over and along the length of the can body 13, with the lower-most fin bearing against flange 17.

Illustrative Dimensions Are As Follows
(Approximate Dimensions in millimeters)

| | | | |
|---|---|---|---|
| Casing 13 | a. O.D. of 13 | 4.70 | |
| | b. rounding 22 | 0.76 | radius |
| Fin 25/27 | a. thickness | 0.127 | |
| | b. O.D. of 25 | 20.83 | |
| | c. I.D. of flange 27 | 4.67 | |
| | d. height of flange 27 | 0.762 | |
| | e. radius of rounding 28 | 0.25 | |
| | f. O.D. of flange 27 at free edge | 4.877 | |
| | g. I.D. of flange 27 at free edge | 4.62 | |
| | h. taper of 27 | 2° | |
| Tool 30 | a. I.D. of 30 | 4.94 | |
| | b. O.D. of 30 | 11 | |

For a still small but somewhat larger size casing 13, of about 50 percent more than 4.70 m.m. diameter, the various parts of the fin are enlarged somewhat, preserving the general relationship of dimensions.

The employment of the flange 27 of uniform internal diameter when assembled to the can provides a means for establishing a uniform and effective heat conducting contact of the fin and throughout 360° and throughout a thickness of the fin and flange or height of the flange for increased conduction and effective cooling or thermal dissipation.

The present heat sink fin for dissipation of undesired heat as a bi-product of operation is low in cost and highly efficient and may be easily applied to the semiconductor by hand or mechanically. In production the fin cost is 1/10 to 2/10 cent.

Since each heat sink fin extends along only a portion of the can height, the indicia on the can end remains exposed.

Having described my invention, I claim:

1. A semiconductor heat sink assembly comprising:

a semiconductor device housed within a metallic can having an unpolished surface of cylindrical shape with a diameter of the order of five millimeters and being closed at its top and at its lower end; said lower end having a base flange including an eyelet through which project a plurality of lead wires in insulated relation; and a heat sink fin including a heat conductive body of disc shape and being formed of a thin flexible foil like metal of a thickness of about 0.127 millimeters and 21 millimeters in diameter; said conductive body at its central portion being apertured and terminating in an axially upstanding annular flange of about 762 millimeters high; said conductive body and flange being snugly assembled over and around said can with an assembly tool and frictionally secured thereto, said disc body aperture and the bore of said upstanding flange being of circular shape for continuous surface registry and uniform spacing throughout 360° and for a portion of the can height.

* * * * *